(12) United States Patent
Takahashi et al.

(10) Patent No.: US 7,791,212 B2
(45) Date of Patent: Sep. 7, 2010

(54) HYBRID MOUNTED DEVICE AND METHOD OF MANUFACTURING THE SAME

(75) Inventors: Morio Takahashi, Tokyo (JP); Hiroyuki Yamazaki, Tokyo (JP); Yukari Deki, Tokyo (JP)

(73) Assignee: NEC Corporation, Tokyo (JP)

( * ) Notice: Subject to any disclaimer, the term of this patent is extended or adjusted under 35 U.S.C. 154(b) by 772 days.

(21) Appl. No.: 11/641,018

(22) Filed: Dec. 19, 2006

(65) Prior Publication Data

US 2007/0170603 A1 Jul. 26, 2007

(30) Foreign Application Priority Data

Dec. 20, 2005 (JP) .............................. 2005-366533

(51) Int. Cl.
*H01L 21/544* (2006.01)
(52) U.S. Cl. .............................. 257/797; 257/E33.179; 257/E21.525
(58) Field of Classification Search ................. 257/797, 257/E23.179, E21.525, 777, 734, 672; 438/14, 438/15, 401; 356/138, 399, 614
See application file for complete search history.

(56) References Cited

U.S. PATENT DOCUMENTS 5,886,971 A * 3/1999 Feldman et al. ........ 369/112.05
6,670,632 B1 * 12/2003 Fujimoto ..................... 257/48
2004/0240085 A1 * 12/2004 Uekawa et al. .............. 359/811

FOREIGN PATENT DOCUMENTS

| JP | 4-99309 | 3/1992 |
|---|---|---|
| JP | 2002-62447 | 2/2002 |
| JP | 2005-148231 | 6/2005 |

* cited by examiner

*Primary Examiner*—Thomas L Dickey
*Assistant Examiner*—Nikolay Yushin
(74) *Attorney, Agent, or Firm*—Young & Thompson (57) ABSTRACT

There is provided a hybrid mounted device that includes a element such as semiconductor laser diode (LD), and a board such as a silicon platform having formed thereon an optical waveguide. The LD is mounted to the silicon platform, and is optically coupled to the optical waveguide. The mounting position of the LD is determined by positioning first alignment marks formed on the board and second alignment marks formed on the LD. In this configuration, initial positional deviation amount measuring marks that can measure the initial positional deviation amount of the first alignment marks themselves are formed on the board. The mounting position of the is corrected to a position where the second alignment marks are shifted with respect to the first alignment marks according to the initial positional deviation amount measured from the initial positional deviation amount measuring marks.

10 Claims, 8 Drawing Sheets

M11: FIRST ALIGNMENT MARKS
M12: SECOND ALIGNMENT MARKS
12: OPTICAL WAVEGUIDE
21: LD
14: PEDESTALS
13: ELECTRODE
11: SILICON PLATFORM

FIG.10 PRIOR ART

INITIAL POSITIONAL DEVIATION AMOUNT (X DIRECTION)

HYBRID MOUNTED DEVICE AND METHOD OF MANUFACTURING THE SAME

BACKGROUND OF THE INVENTION

1. Field of the Invention

The present invention relates to a hybrid mounted device and a method of manufacturing the same, and more particularly, to a device structure that corrects the mounting position by utilizing positional deviation amount measuring marks at the time of mounting a chip, and a method of mounting a chip with high accuracy.

2. Description of the Related Art

A hybrid integrated optical device is realized as a small-sized inexpensive optical device. In the device, an active/passive element such as a laser element (LD: laser diode) or a light-sensitive element (PD: photodiode) is flip-chip mounted onto a silicon platform. The silicon platform is a planar optical circuit board in which an optical waveguide is formed. The optical waveguide and the active/passive element are optically coupled by flip-chip mounting.

Figure 9:
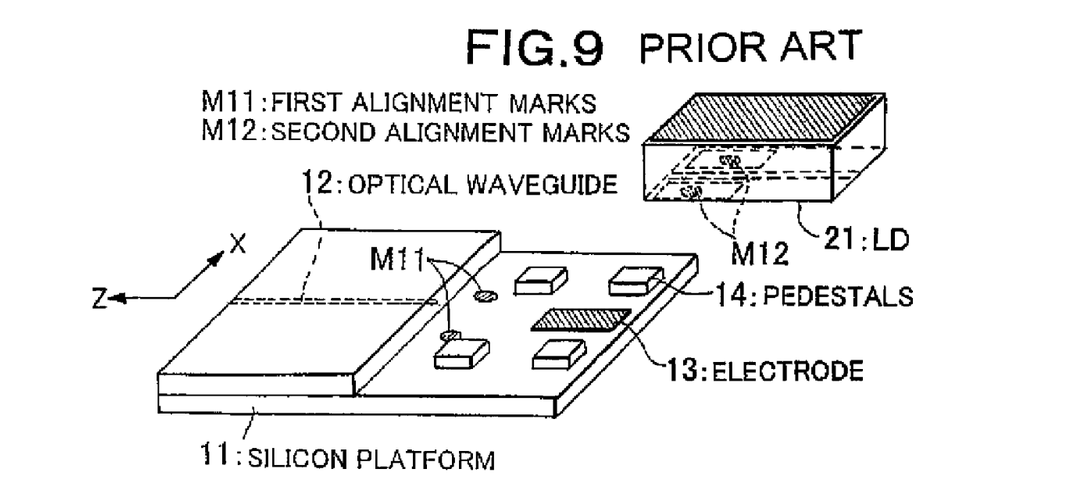
FIG. 9 shows a perspective view indicative of the conventional visual alignment mounting method.
Figure 10:
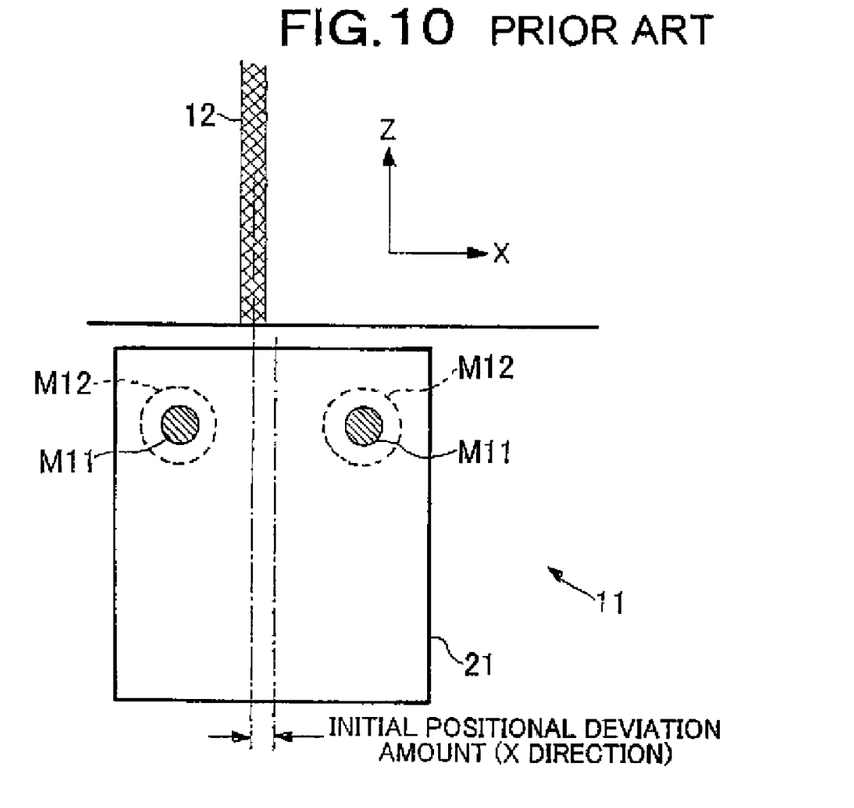
FIG. 10 shows a top view for explaining the manner of mounting a semiconductor laser with respect to an optical waveguide employing the conventional visual alignment mounting method.

In mounting technology used in the above optical device, there is known a method of "visual alignment" that can realize high speed and low cost mounting. According to this method, alignment marks are pre-formed on both a silicon platform and a LD/PD chip, and then image of the marks thereon are recognized by a camera. A mounting position of the LD/PD with respect to the platform is subsequently determined based on the positional information of the alignment marks without driving the LD or PD. FIG. 9 and FIG. 10 show a conventional example of an optical device that comprises a silicon platform and an active/passive element mounted thereon by visual alignment.

In the conventional optical device as shown in FIG. 9 and FIG. 10, a semiconductor laser diode (LD) 21 is flip-chip mounted onto a silicon platform 11. An optical waveguide 12 is formed on the silicon platform 11 by a predetermined semiconductor process. The optical waveguide 12 and the semiconductor laser diode 21 are optically coupled. As shown in FIG. 9, four pedestals 14, which fixes the semiconductor laser 21, are formed on the silicon platform 11. An electrode 13, which is electrically coupled to the semiconductor laser 21 directly, is also formed thereon. Furthermore, alignment marks (mounting position marks) are formed on both the semiconductor laser 21 and the silicon platform 11, respectively. In FIG. 9 and FIG. 10, two first alignment marks (first mounting position marks) M11 are formed at the side of the silicon platform 11, and two second alignment marks (second mounting position marks) M12 are formed at the side of the semiconductor laser 21. Both alignment marks M11 and M12 are used for mounting the semiconductor laser 21 onto the silicon platform 11.

As shown in FIG. 9 and FIG. 10, the first alignment marks M11 and the second alignment marks M12 are configured by circular marks for positioning with their radius made different from one another. With this configuration, in mounting the semiconductor laser 21 onto the silicon platform 11, as shown in FIG. 10, a position on the silicon platform 11 to which the semiconductor laser 21 is mounted is determined by positioning the first alignment marks M11 and the second alignment marks M12 such that both the marks M11 and M12 are concentrically superposed with their centers made to accord with each other by employing the visual alignment mounting method.

On the other hand, along with highly-developed performance and function which are required for optical devices in recent years, the requirement for visual alignment with high accuracy in mounting an LD/PD onto a silicon platform is increasing. Especially, in case of the optical device shown in FIG. 9 and FIG. 10 that optically couples the LD and the optical waveguide formed on the silicon platform, the light confinement effect of the optical waveguide has to be enhanced so as to improve the coupling efficiency. In this way, the spot size of the optical waveguide and that of the LD come close to each other, and the ideal maximum coupling efficiency can be improved. However, in this case, since the spot size comes to be small, a slight positional deviation in mounting undesirably brings about a large coupling loss. Accordingly, in order to enhance the light confinement effect of the optical waveguide to improve the coupling efficiency, there is required a chip mounting technology with super high accuracy that can surely make the positional deviation in mounting equal to or less than 2 μm.

In general, in order to realize such high accuracy, there is employed a method of "active alignment" mounting, under which a current is made to flow in an LD through an LD mounting jig to make the LD emit light, and the coupling state with an optical waveguide is monitored by a photodetector to adjust the optical axis. However, employing this method, a particular mounted device is required, and demerits of complicated mounting procedure and elongated mounting time period are significantly large, which makes it difficult to fulfill the cost requirement of the market. Accordingly, so as to improve the mounting accuracy with the cost suppressed low, it is the best way to employ "passive alignment" mounting technology by the visual alignment, which is used in the past, to the utmost extent.

However, in case of the chip mounting by above-described conventional visual alignment, the mounting accuracy is determined depending on mainly the accuracy of image recognition and the accuracy of mechanical driving, and it has been difficult to surely bond an element with a deviation amount equal to or less than 2 μm. In addition, a silicon platform onto which a chip is mounted is manufactured under a semiconductor wafer process employing the stepper exposure or contact exposure. A positional deviation of approximately 1 to 2 μm is brought about by the manufacturing process.

That is, conventionally, there are raised degradation in the mounting accuracy that pertains to the visual alignment and degradation in the mounting accuracy due to the initial positional deviation of alignment marks. Accordingly, even if alignment marks are formed on a layer which is different from that on which an optical waveguide is formed, and the chip mounting accuracy for the alignment marks is mechanically made highly accurate, as shown in FIG. 9 and FIG. 10, since the position of the alignment marks themselves is deviated with respect to the optical waveguide by 1 to 2 μm (refer to the initial positional deviation in the "x" direction shown in FIG. 10), consequently it is difficult to bond a chip certainly with accuracy equal to or less than 2 μm in positional deviation, and a countermeasure for the situation is required.

For example, in case of JP-A-2002-062447, since mounting markers are not concurrently formed at the time of forming an optical waveguide, similar degradation in the mounting accuracy is raised. In addition, since the positional deviation amount and positional deviation direction vary from chip to chip depending on the lot, deflection of wafer, in-plane position on wafer, etc., the initial positional deviation cannot be completely removed.

Furthermore, in the conventional semiconductor wafer process, even if the positional deviation amount between patterns is managed by the vernier caliper pattern as is disclosed in JP-A-H04(1992)-099309, occurrence of the positional deviation of alignment marks in the patterning process, which depends on a device, cannot be prevented essentially. Therefore, only managing the positional deviation amount does not lead to the improvement in the chip mounting accuracy.

Due to above-described plural factors of degradation in the mounting accuracy, in the conventional technique, it has been very difficult to carry out chip mounting certainly with high accuracy equal to or less than 2 µm in positional deviation with desired process yield.

SUMMARY OF THE INVENTION

An object of the present invention is to provide a device structure that enables mounting a chip with high accuracy in case above-described initial positional deviation is involved in the structure, and a method of mounting a chip, overcoming the above-mentioned drawbacks.

According to the present invention, there is provided a hybrid mounted device, comprising: an element; a board onto which the element is mounted; first mounting position marks formed on the board; second mounting position marks formed on the element, a mounting position of the element on the board being determined by positioning the first mounting position marks and the second mounting position marks with each other; and initial positional deviation amount measuring marks which are so formed on the board as to be able to measure an initial positional deviation amount of the first mounting position marks. The mounting position of the element being corrected to a position where the second mounting position marks are shifted with respect to the first mounting position marks, according to the initial positional deviation amount of the first mounting position marks measured from the initial positional deviation amount measuring marks.

Desirably, an absolute value of the positional deviation amount between the first mounting position marks and the second mounting position marks is equal to or within ±2 µm from an absolute value of the initial positional deviation amount measured from the initial positional deviation amount measuring marks.

According to the present invention, there is also provided a method of manufacturing a hybrid mounted device that includes an element and a board onto which the element is mounted, and a mounting position of the element on the board is determined by positioning first mounting position marks formed on the board and second mounting position marks formed on the element with each other, the hybrid mounted device including the steps of forming initial positional deviation amount measuring marks which can measure an initial positional deviation amount of the first mounting position marks on the board, and correcting the mounting position of the element to a position where the second mounting position marks are shifted with respect to the first mounting position marks according to the initial positional deviation amount of the first mounting position marks measured from the initial positional deviation amount measuring marks.

Desirably, the step of correcting the mounting position of the element includes the step of correcting the mounting position of the element such that an absolute value of the positional deviation amount between the first mounting position marks and the second mounting position marks is equal to or within ±2 µm from an absolute value of the initial positional deviation amount obtained from the initial positional deviation amount measuring marks.

According to the present invention, even in the case in which the initial positional deviation is raised at the time of mounting an element, it becomes possible to realize chip mounting with super high accuracy.

DETAILED DESCRIPTION OF THE PREFERRED EMBODIMENTS

The hybrid mounted device and method of manufacturing the same according to the present invention will further be described below.

The hybrid mounted device in this embodiment provides a device structure that corrects the mounting position by utilizing positional deviation amount measuring marks at the time of mounting a chip, and a method of mounting a chip with high accuracy so as to realize a chip mounting manner with super high accuracy that can make the positional deviation in mounting equal to or within 2 µm.

This embodiment is configured as follows. That is, the hybrid mounted device includes an element being a semiconductor chip, and a board or circuit board onto which the chip is mounted. The element and the board have formed thereon mounting position marks, or position marks for loading or mounting a chip, corresponding to alignment marks. The board has formed thereon initial positional deviation amount measuring marks for the mounting position marks.

In this configuration, the absolute value of the positional deviation amount between the mounting position marks formed on the mounted element and the mounting position marks formed on the board is equal to or within ±2 μm from the absolute value of the initial positional deviation amount obtained from the initial positional deviation amount measuring marks. That is, in this embodiment, the mounting position marks formed on the element and board are shifted by an amount equal to the initial positional deviation amount of the mounting position marks in a direction of offsetting the initial positional deviation amount. In this way, necessarily, the positional deviation between the element and the board having the element mounted thereon is removed. On the other hand, since the initial positional deviation amount cannot be offset completely, actually, the absolute value of the positional deviation amount for the mounting position marks formed on the board may be equal to or within ±2 μm from the absolute value of the initial positional deviation amount obtained form the initial positional deviation amount measuring marks. When the positional deviation is settled in this range, the functional degradation can be suppressed in the practical use (for example, the excess loss is equal to or within 3 dB in case of the optical axis mounting for an optical waveguide and an LD).

In above-described configuration, the initial positional deviation amount measuring marks for the mounting position marks formed on the board may be the vernier caliper pattern. In this way, the positional deviation amount can be measured most accurately for correcting the mounting position of the element. Furthermore, in case of employing the vernier caliper pattern, the positional deviation amount can be accurately checked with eyes, which is effective in reducing capital investment at the time of making the transition to automation. Moreover, there is brought about an advantage that it becomes possible to measure all chips to see the degree of the initial positional deviation raised actually with respect to the chips in an easily understood manner. Then, this data can be utilized in specifying factors of occurrence of the initial positional deviation, improving a manufacturing process that can reduce the initial positional deviation, etc. It surely is possible to automatically measure the deviation amount by employing an image recognition apparatus using the vernier caliper pattern.

Furthermore, the mounting position marks formed on the board may be the vernier caliper pattern. In this way, after mounting a chip, it becomes possible to check whether or not a measured positional deviation amount between the mounting position marks and the chip actually falls within the assumed positional deviation amount. Especially, this is very important in the production management at the time of initial production. Moreover, this is useful in finding out defects of a mounting device by a spot check or classifying factors of defects.

Moreover, as at least one of element, a semiconductor laser can be used. The method of mounting a chip in this embodiment is effective when mounting a semiconductor laser that has its light emission spot size made small and has to be mounted with super high accuracy.

Moreover, in above-described configuration, the board may be a planar optical circuit board having an optical waveguide formed on part thereof. Under the conventional mounting technology, it has been difficult to optically couple a semiconductor laser and an optical waveguide with high efficiency. On the other hand, by employing the device configuration of this embodiment, chip mounting with sufficiently high accuracy can be realized.

Moreover, the initial positional deviation amount measuring marks for the mounting position marks formed on the board may be so configured as to be able to detect the positional deviation amount at least in a direction perpendicular to the light propagation direction of the optical waveguide. Especially, in optically coupling a semiconductor laser and an optical waveguide with high efficiency, as compared with the optical axis direction, the positional deviation in a direction perpendicular to the optical axis direction has a significantly adverse influence on the coupling efficiency of the optical coupling. Therefore, it is important to bond a semiconductor laser with high accuracy in a direction perpendicular to the optical axis direction, which can be realized by this embodiment.

Moreover, with respect to the mounting position marks formed on the board and the initial positional deviation amount measuring marks for the mounting position marks formed on the board, one or both of them may be composed of at least two marks or more. When there are two or more alignment marks, it becomes possible to detect the rotational deviation that cannot be detected by a single minute mark, which can enhance the accuracy of the mounting position.

The hybrid mounted device may be a device for optical communication. This is because, mainly, a device for optical communication requires such a mounting technology with super high accuracy.

The method of manufacturing a hybrid mounted device in this embodiment, which manufactures a hybrid mounted device including an element and a board having mounted thereon the element, forms mounting position marks on the element and board, and forms initial positional deviation amount measuring marks for the mounting position marks on the board. Then, the method corrects the mounting position such that the absolute value of the positional deviation amount between the mounting position marks formed on the mounted element and the mounting position marks formed on the board is equal to or within ±2 μm from the absolute value of the initial positional deviation amount obtained form the initial positional deviation amount measuring marks.

Fundamentally, the conventional device is provided with sufficient performance with respect to the mechanical mounting accuracy. On the other hand, so far, due to the positional deviation error pertaining to a chip, there is raised a contradiction that the variation of the mounting position is brought about conversely in case the performance is exerted. So, by correcting the initial positional deviation as is carried out in this embodiment, the performance can be sufficiently pulled out and exerted, enabling chip mounting with super high accuracy.

Furthermore, in correcting the mounting position, an image pick up device and an automatic recognition device may be used. This is because, even if checking with eyes is mainly performed to enhance the accuracy at first, automatic correction chip mounting by the automatic recognition has to carried out so as to lower the cost finally.

The embodiment according to the present invention will further be described below with reference to the accompanying drawings. In the following configuration, parts or components similar to those of the conventional example shown in FIG. 9 and FIG. 10 are indicated with the same reference numerals, and detailed explanation of which will be omitted.

First Embodiment

Figure 1:
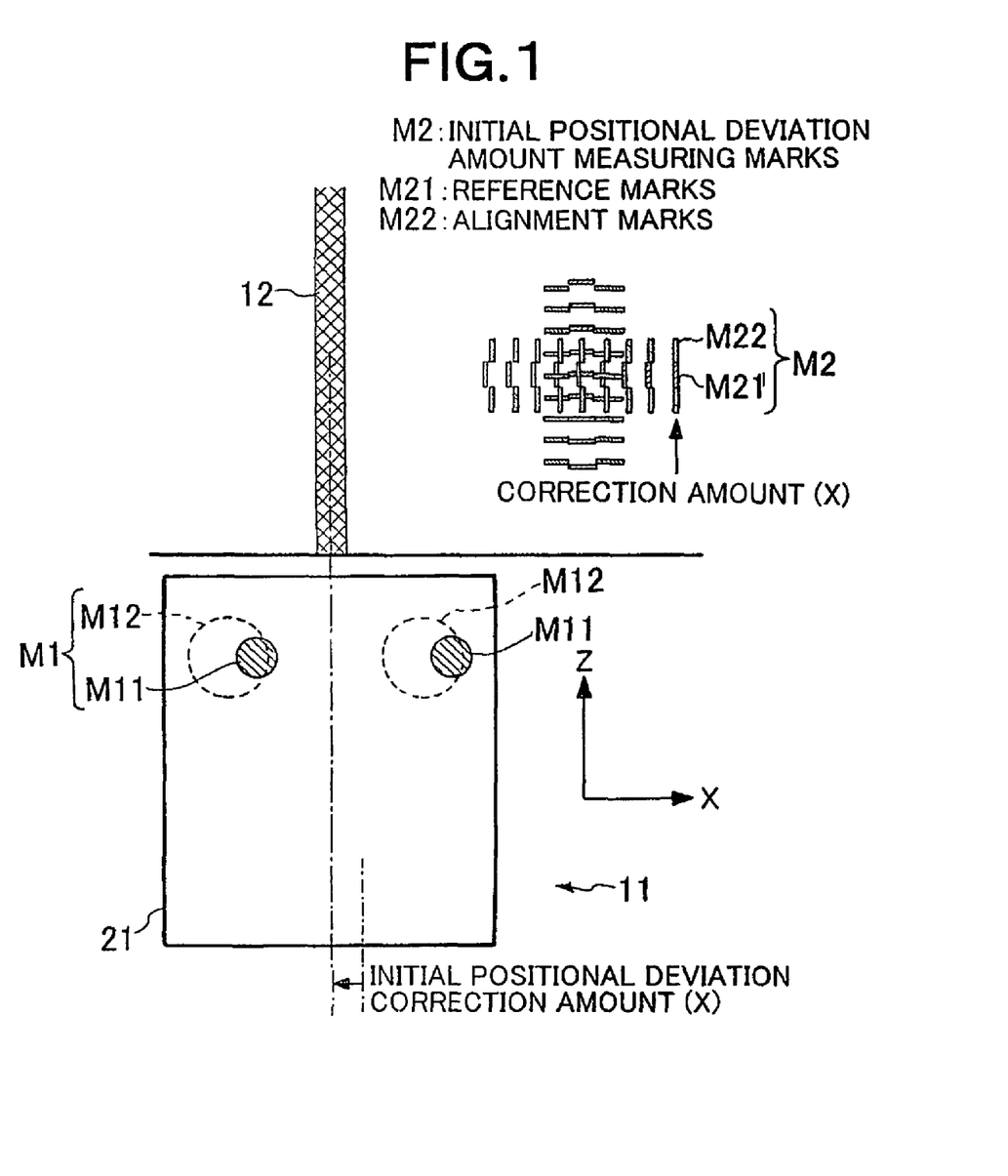
FIG. 1 shows a top view of an example for explaining the manner of mounting a semiconductor laser with respect to an optical waveguide with high accuracy employing a hybrid mounted device and method of manufacturing the same in the first embodiment according to the present invention.

FIG. 1 shows a top view for explaining the manner of mounting a semiconductor laser diode (LD) 21 with respect to an optical waveguide 12 with high accuracy for optical axis alignment employing a hybrid mounted device and method of manufacturing the same in the first embodiment according to the present invention.

In an optical device (hybrid mounted device) in this embodiment shown in FIG. 1, the semiconductor laser diode (LD) 21 is flip-chip mounted onto a silicon platform (planar optical circuit board) 11. The optical waveguide 12 is formed on the silicon platform 11. The laser diode 21 and the optical waveguide 12 are optically coupled by flip chip mounting.

As alignment marks (mounting position marks) M1 for the positioning used in mounting the semiconductor laser 21 onto the silicon platform 11 under the flip chip mounting, the silicon platform 11 side has formed thereon two first alignment marks (first mounting position marks) M11, and the semiconductor laser 21 side has formed thereon two second alignment marks (second mounting position marks) M12, respectively. The first alignment marks M11 and the second alignment marks M12 are configured by circular marks for the positioning with their radius made different from one another. With this configuration, in mounting the semiconductor laser 21 onto the silicon platform 11, by positioning the first alignment marks M11 and the second alignment marks M12 such that both the marks are concentrically superposed with their centers made to accord with each other by employing the visual alignment mounting method, a position on the silicon platform 11 to which the semiconductor laser 21 is mounted is determined.

As shown in above-described configuration, according to the optical device in this embodiment, initial positional deviation amount measuring marks (marks for detecting positional deviation) M2 that can measure the initial positional deviation amount of the first alignment marks M11 themselves are formed on the silicon platform 11. Then, according to the initial positional deviation amount obtained by the initial positional deviation amount measuring marks M2, the position on the silicon platform 11 to which the semiconductor laser 21 is mounted can be corrected.

Figure 2:
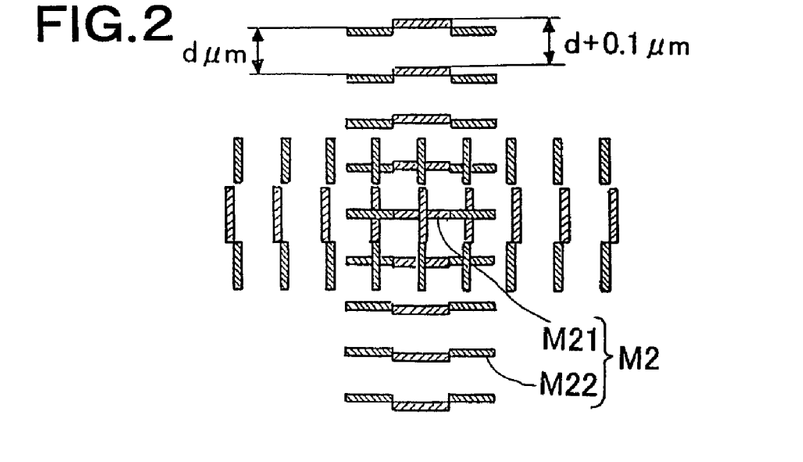
FIG. 2 shows a top view of an example of initial positional deviation amount measuring marks used in the first embodiment.

FIG. 2 shows an example of the initial positional deviation amount measuring marks M2 used in this embodiment. In this embodiment, as an example of the initial positional deviation amount measuring marks M2, the vernier caliper pattern (crisscross pattern) is employed, as shown in FIG. 2. This vernier caliper pattern is composed of reference marks M21 configuring scales which are arranged at inner one location (referred to as inner scales, hereinafter), and alignment marks M22 configuring scales which are arranged at outer two locations sandwiching the inner scales (referred to as outer scales, hereinafter). The inner scales of the reference marks M21 and the outer scales of the alignment marks M22 are arranged by a predetermined number (nine scales in the "x" direction or right-and-left direction, and nine scales in the "z" direction or up-and-down direction, in FIG. 2) with a preset pitch set up therebetween, respectively, in two directions or in the "x" direction and in the "z" direction.

In the vernier caliper pattern shown in FIG. 2, a design pitch of d+0.1 μm is set up for the inner scales of the reference marks M21, and a design pitch of d μm is set up for the outer scales of the alignment marks M22. In designing, as shown in FIG. 2, with respect to center inner scales (crisscross mark) of the reference marks M21, which are directed in the up-and-down direction and right-and-left direction and are superposed at the center thereof, center outer scales of the alignment marks M22, which are directed in the up-and-down direction and right-and-left direction and, are so arranged as to form straight lines.

The reference marks M21 are formed in the photolithography process using the same photomask, to be described later, at the time of forming the optical waveguide 12. Furthermore, the alignment marks M22 are formed in the photolithography process using the same photomask, to be described later, at the time of forming the first alignment marks M11. Accordingly, the positional deviation amount obtained by the vernier caliper pattern configured by the reference marks M21 and alignment marks M22 becomes the initial positional deviation amount of the first alignment marks M11 with respect to the optical waveguide 12.

So, when the positional deviation of the first alignment marks M11 is raised with respect to the optical waveguide 12, accordingly, the positions where inner scales of the reference marks M21 and outer scales of the alignment marks M22 form straight lines, the straightly arranged positions, are shifted from the central position in the up-and-down direction and right-and-left direction. Accordingly, by recognizing the straightly arranged positions of both the scales, the initial positional deviation amount of the first alignment marks M11 with respect to the optical waveguide 12 can be measured to an accuracy of 0.1 μm.

That is, when the n-th inner scale from the center inner scale of the reference marks M21 form a straight line together with outer scales of the alignment marks M22, a positional deviation of 0.1×n μm is raised in this direction. Accordingly, in the up-and-down direction and right-and-left direction of the vernier caliper pattern, when positions where inner scales of the reference marks M21 and outer scales of the alignment marks M22 form straight lines are detected, the accurate positional deviation amount of the first alignment marks M11 with respect to the optical waveguide 12 can be measured.

Figure 3:
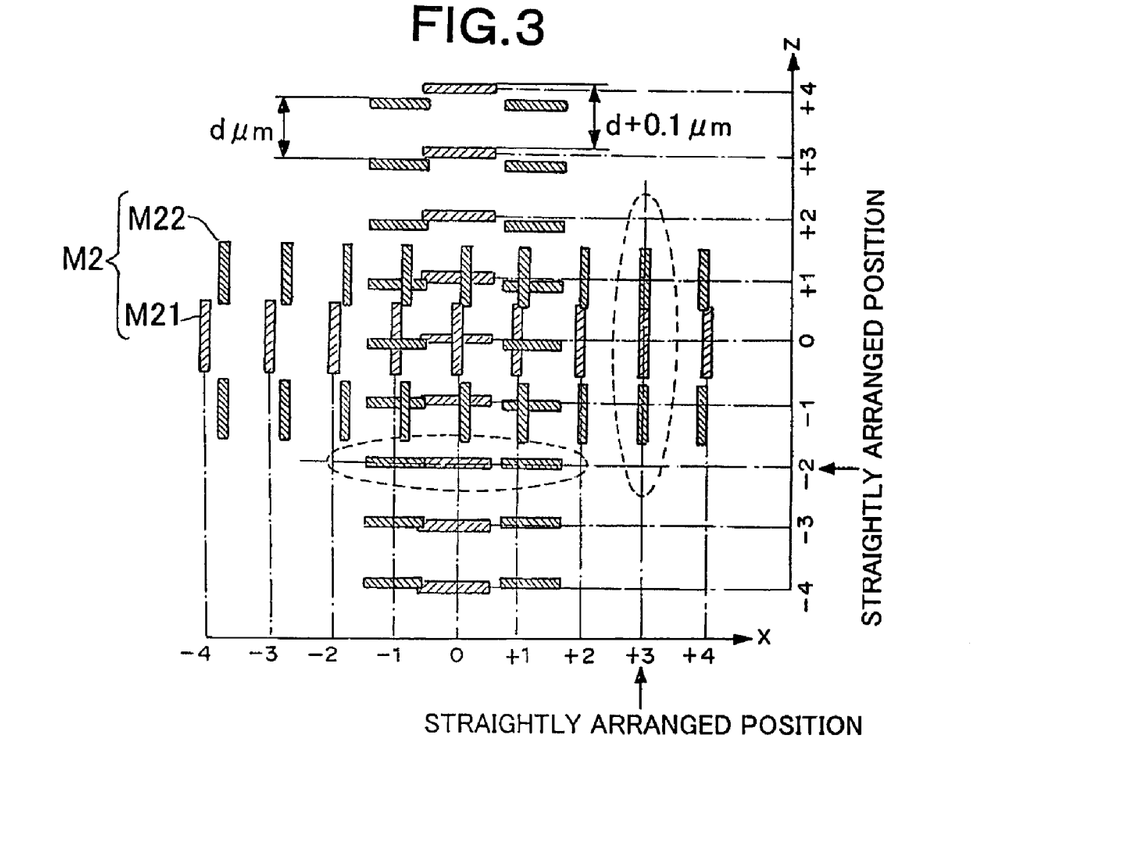
FIG. 3 shows a top view of an example of the initial positional deviation amount measuring marks in the case in which the positional deviation is actually raised in the first embodiment.

For example, it is assumed that the vernier caliper pattern shown in FIG. 3 is formed after forming the alignment marks M22. In this case, in the vernier caliper pattern, positions where inner scales of the reference marks M21 and outer scales of the alignment marks M22 form straight lines (straightly arranged positions) are a position of the third inner scale ("x"=+3) in the right direction (+"x" direction) from the center inner scale and a position of the second inner scale ("z"=−2) in the down direction (−"z" direction) from the center inner scale. Accordingly, in this case, the alignment marks M22 are deviated with respect to the reference marks M21 by 0.1×(+3)=+0.3 μm in the "x" direction and by 0.1×(−2)=−0.2 μm in the "z" direction. In this case, a design pitch of d+0.1 μm is set up for the inner scales of the reference marks M21. On the other hand, in case a design pitch of d+0.05 μm is set up, the positional deviation amount can be measured to an accuracy of 0.05 μm. The accuracy of measurement may be varied depending on an element to be mounted.

Next, the method of forming the initial positional deviation amount measuring marks M2 will be explained.

Figure 4A:
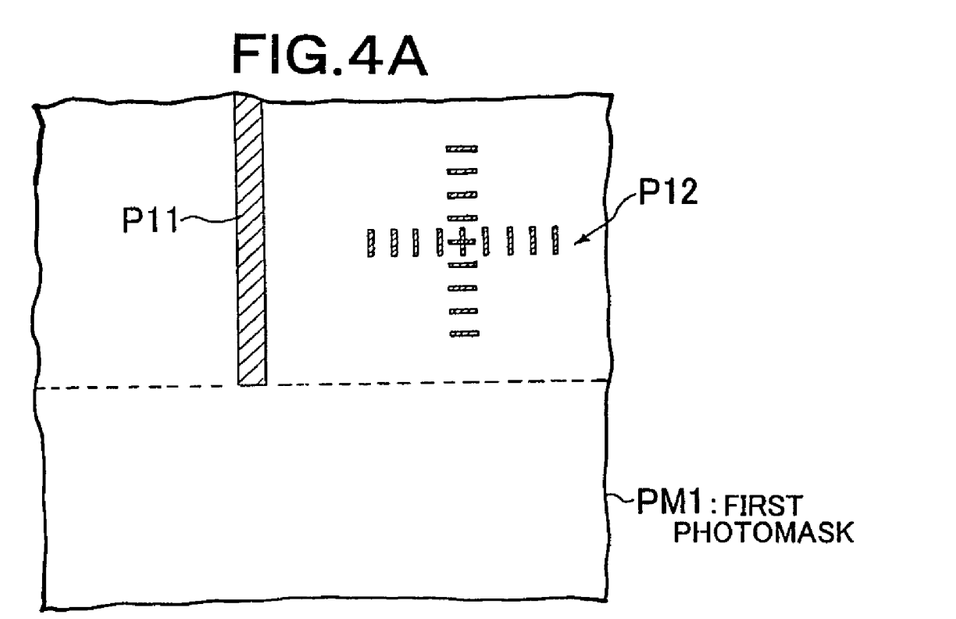
FIG. 4A shows an example of a first photomask that is used in forming an optical waveguide.

Firstly in a process prior to the semiconductor process (photolithography process) for the silicon platform 11, at the time of forming the optical waveguide 12, the reference marks M21 are concurrently formed using a first photomask PM1. FIG. 4A shows an example of the first photomask PM1. As shown in FIG. 4A, the first photomask PM1 has formed thereon, in addition to a pattern P11 for the optical waveguide 12, a pattern P12 for the reference marks M21 of the vernier caliper pattern is formed. As a result, the positional relationship between the reference marks M21 and the optical waveguide 12 formed on the silicon platform 11 depends on the first photo mask PM1, which substantially meets the design requirement. In this embodiment, the error comes to be equal to or less than 1 μm.

Figure 4B:
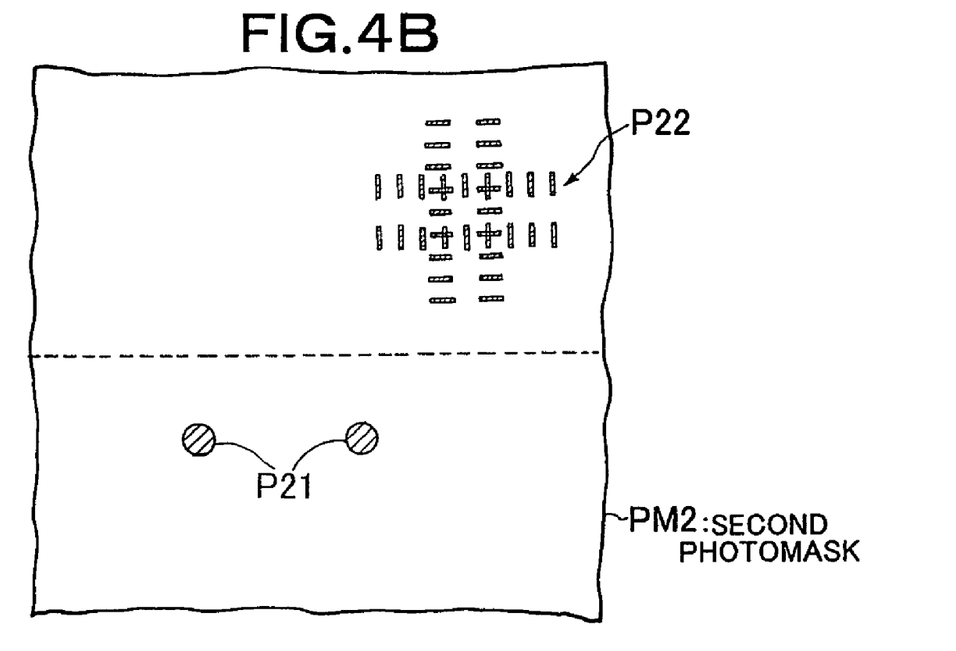
FIG. 4B shows an example of a second photomask that is used in forming first alignment marks.

Next, with respect to thus formed optical waveguide 12, in a process after the semiconductor process, the first alignment marks M11 are formed using a second photomask PM2. In general, the first alignment marks M11 are made of a material including metal such as Au.

FIG. 4B shows an example of the second photomask PM2. As shown in FIG. 4B, the second photomask PM2 has formed thereon, in addition to a pattern P21 for the first alignment marks M11, a pattern P22 for the alignment marks M22 of the vernier caliper pattern. That is, as the vernier caliper pattern, a pattern for the alignment marks M22 being the outer scales whose mark pitch is slightly different from that of the inner scales of the reference marks M21 of the optical waveguide 12 side is prepared such that the reference marks M21 being marks for detecting positional deviation of the optical waveguide 12 side correspond with the second photomask PM2 for the first alignment marks M11. In this way, at the time of forming the first alignment marks M11, the alignment marks M22 of the vernier caliper pattern are formed.

As a result, the positional relationship between the alignment marks M22 of the vernier caliper pattern and the first alignment marks M11 depends on the second photomask PM2, which substantially meets the design requirement similar to the case of the optical waveguide 12. In this embodiment, the error comes to be equal to or less than 1 μm. Accordingly, the positional deviation amount compared by the vernier caliper pattern configured by the alignment marks M22 and reference marks M21 becomes equal to the positional relationship (positional deviation amount) between the optical waveguide 12 and the first alignment marks M11.

After forming the vernier caliper pattern configuring the initial positional deviation amount measuring marks M2, as has been described above, at the time of mounting the semiconductor laser 21 onto the silicon platform 11, as shown in FIG. 1, the first alignment marks M11 of the semiconductor laser 21 side and the second alignment marks M12 of the silicon platform 11 side are intentionally shifted by an amount equal to the positional deviation amount in absolute value measured from the reference marks M21 and alignment marks M22 of the vernier caliper pattern (in FIG. 1, correction amount (x) in the "x" direction is represented) such that the positional deviation is offset (in FIG. 1, refer to initial positional deviation correction amount (x) in the "x" direction). In this way, chip mounting with super high accuracy, which has not been realized by the conventional mounting method using only the first alignment marks M1 and second alignment marks M12, can be realized.

That is, under the conventional method employing the alignment marks M1 (first alignment marks M11 and second alignment marks M12), the initial positional deviation explained referring to FIG. 10 is undesirably raised. On the other hand, according to the embodiment, the initial positional deviation amount between the optical waveguide 12 and the first alignment marks M11 is measured using the initial positional deviation amount measuring marks M2 configured by the reference marks M21 and alignment marks M22 of the vernier caliper pattern.

Then, after carrying out alignment for the mounting position of the semiconductor laser 21 using the alignment marks M1, the mounting position of the semiconductor laser 21 is corrected to a position where the second alignment marks M12 are shifted with respect to the first alignment marks M11 by an amount measured using the initial positional deviation amount measuring marks M2.

In this way, the semiconductor laser 21 is mounted to a position on the silicon platform 11, which is shifted from the position determined by the alignment marks M1. That is, in this embodiment, the second alignment marks M12 are shifted with respect to the first alignment marks M11 in the direction of offsetting the initial positional deviation by an amount equal to the initial positional deviation amount obtained by the initial positional deviation amount measuring marks M2. As a result, the positional deviation between the optical waveguide 12 and the semiconductor laser 21 is substantially removed.

Second Embodiment

Figure 5:
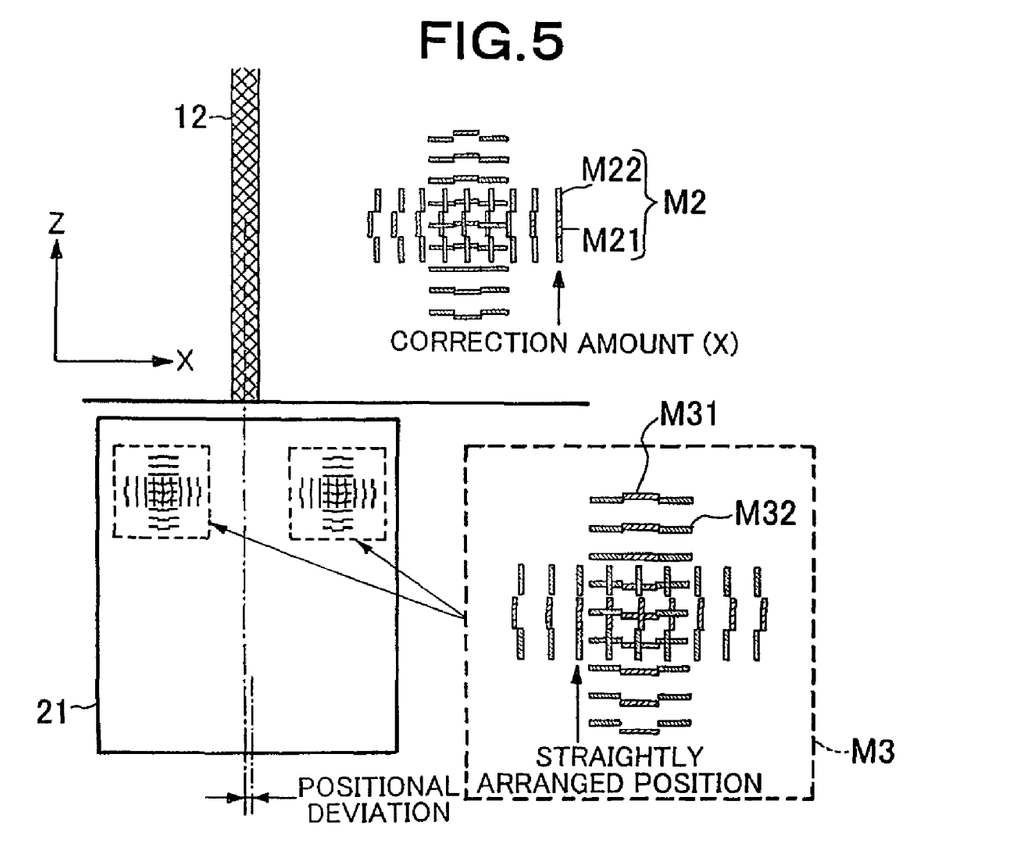
FIG. 5 shows a top view of an example for explaining the manner of mounting a semiconductor laser with respect to an optical waveguide with high accuracy employing a hybrid mounted device and method of manufacturing the same in the second embodiment according to the present invention.

FIG. 5 shows a top view for explaining the manner of mounting the semiconductor laser 21 with respect to the optical waveguide 12 with high accuracy for optical axis alignment employing a hybrid mounted device and method of manufacturing the same in the second embodiment according to the present invention. The second embodiment is different from the first embodiment in that the vernier caliper pattern is used for the alignment marks.

That is, as shown in FIG. 5, alignment marks M3 in this embodiment are configured by first alignment marks M31 formed on the silicon platform 11 side and second alignment marks M32 formed on the semiconductor laser 21 side. Of these, the first alignment marks M31 configure inner scales of the vernier caliper pattern similar to the reference marks M21 of the initial positional deviation amount measuring marks M2. Furthermore, the second alignment marks M32 configure outer scales of the vernier caliper pattern similar to the alignment marks M22 of the initial positional deviation amount measuring marks M2. Other configuration is similar to that of the first embodiment.

In the example shown in FIG. 5, after the semiconductor laser 21 is mounted, the positional deviation is raised between the optical waveguide 12 and the semiconductor laser 21. In this example, when taking a look at only the "x" direction, in case of the vernier caliper pattern with an accuracy of 0.1 μm, the positional deviation amount that can be seen from the vernier caliper pattern of the initial positional deviation amount measuring marks M2 is $0.1 \times (+4) = +0.4$ μm in the "x" direction (correction amount (x) in FIG. 5: refer to the fourth inner scale in the right direction (+"x" direction) from the center inner scale).

Accordingly, so as to bond the semiconductor laser 21 with no positional deviation, outer scales of the second alignment marks M32 have to form a straight line together with an inner scale of the first alignment marks M31 at the position of −0.4 μm in the "x" direction. On the other hand, in this embodiment, outer scales of the second alignment marks M32 and an inner scale of the first alignment marks M31 form a straight line at the position of $0.1 \times (-2) = -0.2$ μm in the "x" direction (straightly arranged position in FIG. 5: refer to the second inner scale in the left direction (−"x" direction) from the center inner scale). This means that, even if it is intended that the semiconductor laser 21 be mounted onto the position of −0.4 μm, actually, the position is deviated by +0.2 μm in the "x" direction due to the mechanical error. Accordingly, in the example shown in FIG. 5, it can be seen that the semiconductor laser 21 is mounted to the silicon platform 11 with its mounting position deviated by +0.2 μm in the "x" direction.

In case the first alignment marks M31 and second alignment marks M32 are circular marks as in the case of the first embodiment, it can be considered that the positional deviation amount is measured by detecting the center of gravity using an automatic recognition device after mounting. In this case, since the error in detecting the center of gravity is included, it can be considered that the measurement turns out to be a result that there is raised no positional deviation in some cases. In this case, since the optical coupling efficiency is degraded since the positional deviation is actually raised, it is difficult to judge whether the positional deviation is due to the mechanical accuracy error of the device side or due to the measurement error of a gravity center detection device.

On the other hand, according to this embodiment, since the first alignment marks M31 and second alignment marks M32 are of the vernier caliper pattern, the accuracy in detecting the positional deviation can be improved, and the error in detecting the center of gravity can be determined by detection with eyes or automatic detection. Furthermore, the device performance in development stage can be checked, and the occurrence of defects in the device can be found out immediately, which are useful in the production management. Originally, in a mounting technology with super high accuracy equal to or less than +2 μm in positional deviation, it can be easily imagined that the positional deviation is raised due to various causes, and it is very important to prepare specific methods to judge the causes of such defects in realizing amounting technology with super high accuracy with desired process yield.

Third Embodiment

Figure 6:
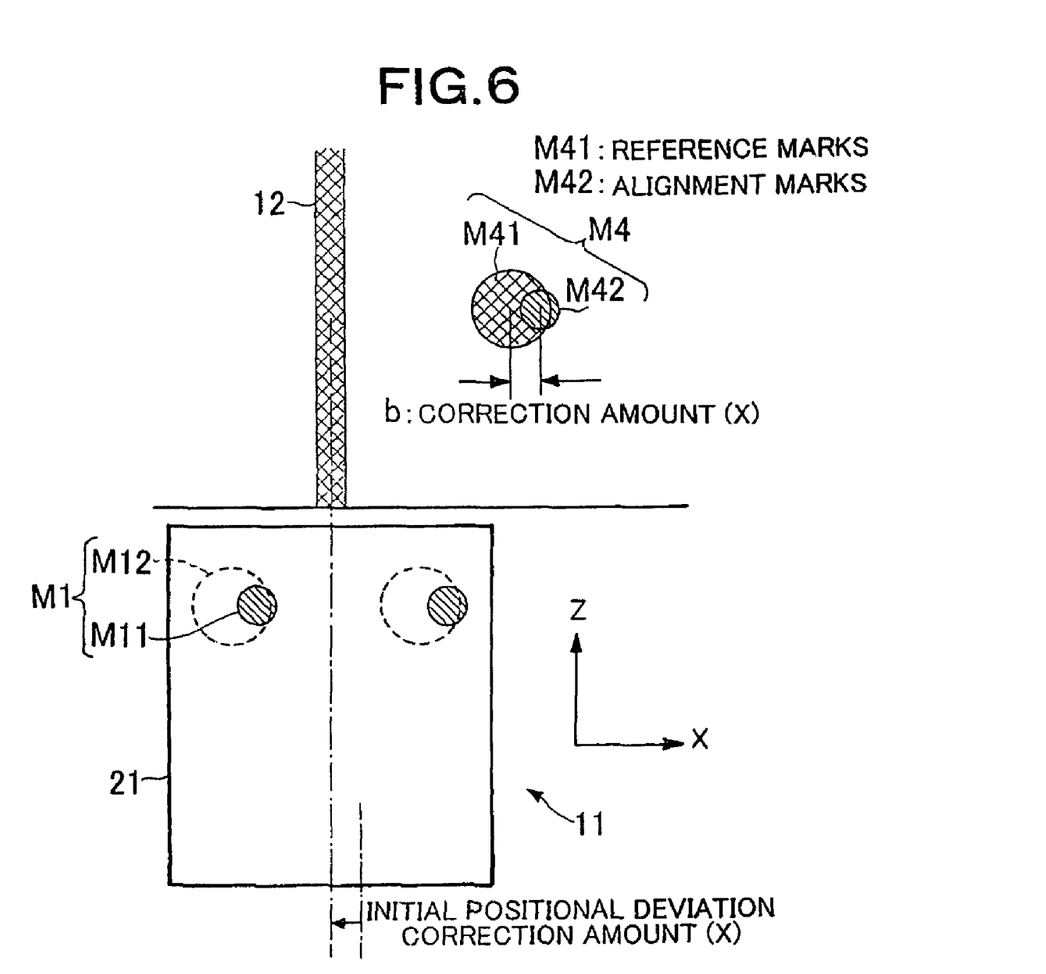
FIG. 6 shows a top view of an example for explaining the manner of mounting a semiconductor laser with respect to an optical waveguide with high accuracy employing a hybrid mounted device and method of manufacturing the same in the third embodiment according to the present invention.

FIG. 6 shows a top view for explaining the manner of mounting the semiconductor laser 21 with respect to the optical waveguide 12 with high accuracy for optical axis alignment employing the hybrid mounted device and method of manufacturing the same in the third embodiment according to the present invention. The third embodiment is different from the first embodiment in that the vernier caliper pattern is not used for the initial positional deviation amount measuring marks but circular marks similar to the alignment marks M1 in the first embodiment are used therefor.

That is, as shown in FIG. 6, initial positional deviation amount measuring marks M4 in this embodiment are configured by a circular reference mark M41 which is formed at the time of forming the optical waveguide 12 using the same photomask, and a circular alignment mark M42 which is formed at the time of forming the first alignment marks M11 using the same photomask. Other configuration is similar to that of the first embodiment.

Generally, in case of performing mounting under the positioning by automatically recognizing marks, the center of gravity is detected for the marks, and a necessary shift amount of the semiconductor laser to make thus detected gravity centers correspond with each other is calculated, and the semiconductor laser is actually shifted by a shift means such as a stepping motor by thus calculated necessary shift amount to be mounted. In detecting the center of gravity, in the semiconductor manufacturing process, circular marks whose center of gravity is hardest to deviate are suitable. That is, in the semiconductor process in which the patterning and etching processing are repeated, in case circular marks are used, even if reduction or enlargement in size is raised due to the process error in both the processing, the deviation of the center of gravity is hard to bring about. Furthermore, circular marks are often used in the conventional manufacturing process, and it is significantly advantageous that there is no need of changing the automatic recognition program widely. Accordingly, in case the accuracy of detecting the positional deviation amount of the center of gravity by the automatic recognition is sufficient in mounting even if circular marks are used, it becomes possible to realize mounting of high speed and low cost with high accuracy by employing the method in this embodiment.

Fourth Embodiment

Figure 7:
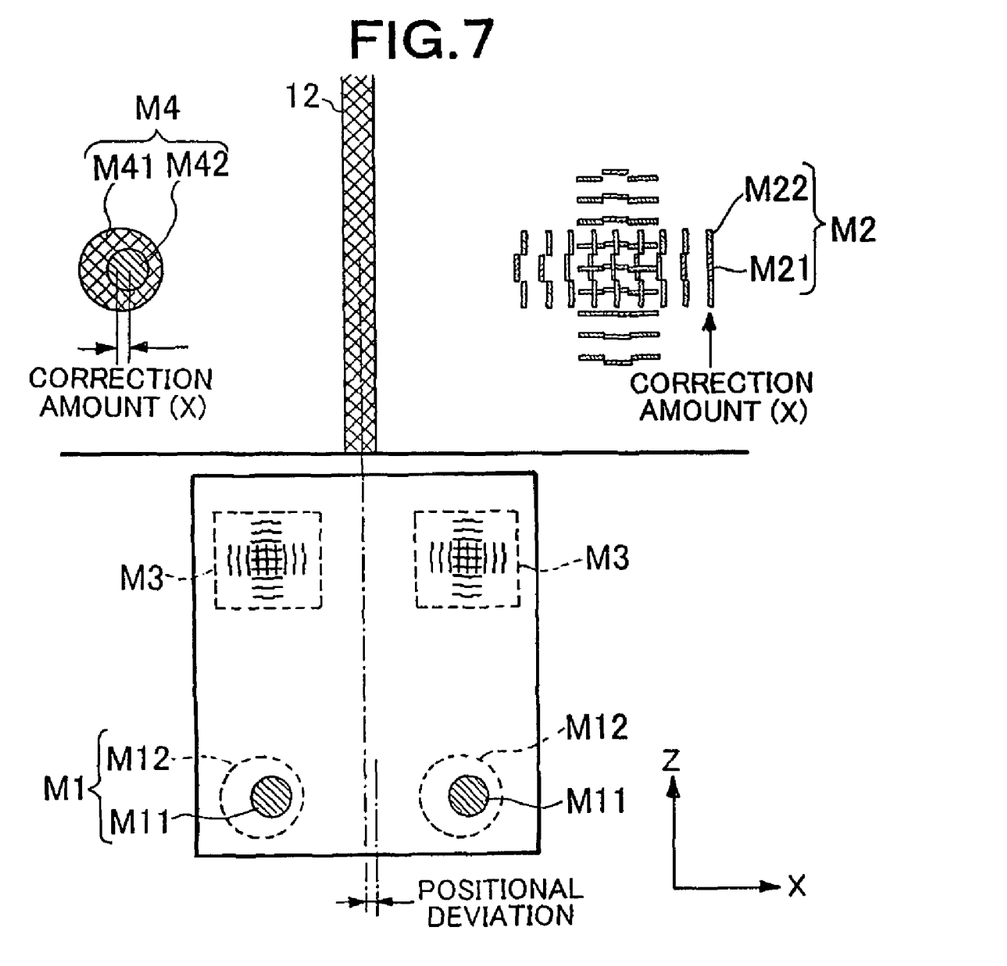
FIG. 7 shows a top view of an example for explaining the manner of mounting a semiconductor laser with respect to an optical waveguide with high accuracy employing a hybrid mounted device and method of manufacturing the same in the fourth embodiment according to the present invention.

FIG. 7 shows a top view for explaining the manner of mounting the semiconductor laser 21 with respect to the optical waveguide 12 with high accuracy for optical axis alignment employing a hybrid mounted device and method of manufacturing the same in the fourth embodiment according to the present invention. In the first to third embodiments, any one of the conventionally used circular marks or the vernier caliper pattern enabling positional deviation detection with higher accuracy is employed for the first and second alignment marks and the initial positional deviation amount measuring marks. The fourth embodiment is different from the first to third embodiments in that both the circular marks and the vernier caliper pattern are prepared for the first and second alignment marks and the initial positional deviation amount measuring marks, respectively.

That is, as shown in FIG. 7, the alignment marks in this embodiment are configured by the alignment marks M1 (first alignment marks M11 and second alignment marks M12) being circular marks similar to those of the first embodiment and the alignment marks M3 of the vernier caliper pattern similar to those of the third embodiment. Furthermore, the initial positional deviation amount measuring marks in this embodiment are configured by the initial positional deviation amount measuring marks M2 (reference marks M21 and alignment marks M22) of the vernier caliper pattern similar to those of the first embodiment and the initial positional deviation amount measuring marks M4 (a reference mark M41 and an alignment mark M42) being circular marks similar to those of the third embodiment. Other configuration is similar to that of the first embodiment.

In general, even if circular marks are hardly influenced by the manufacturing process and are user-friendly due to the practical accomplishment as marks for detecting the center of gravity, the detection accuracy of the deviation amount undesirably depends on an observation device. On the other hand, even if the vernier caliper pattern is significantly superior to the circular marks in the detection accuracy of the deviation amount, the pattern is minute and is hard to extract by an image recognition apparatus.

Accordingly, by employing the circular marks and the vernier caliper pattern concurrently as in the case of this embodiment, for example, the circular marks are used to detect the center of gravity to perform the first positioning for mounting, and then the vernier caliper pattern is used to perform the positioning for mounting to further improve the accuracy. Thus, it becomes possible to raise the mounting speed and to improve the accuracy at the same time.

Fifth Embodiment

Figure 8:
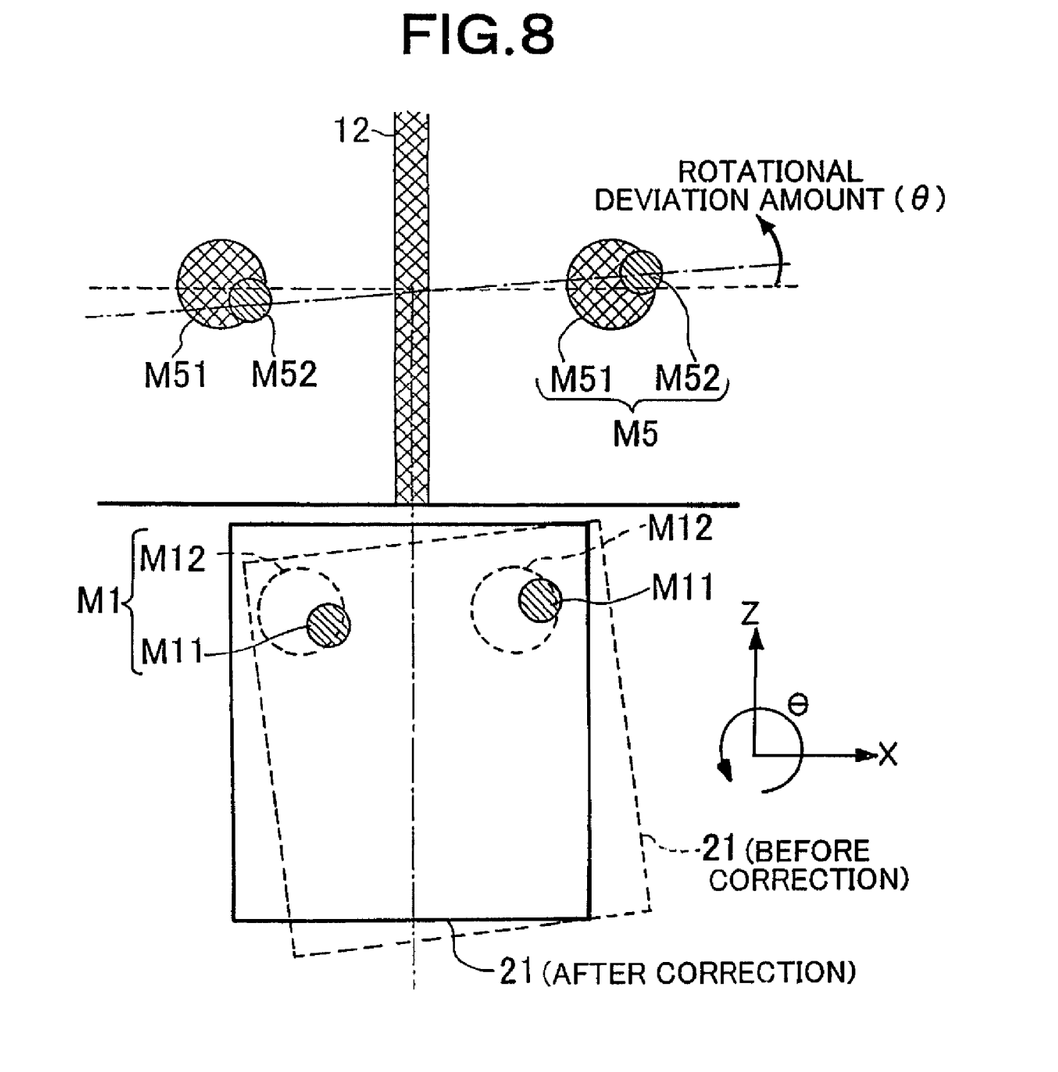
FIG. 8 shows a top view of an example for explaining the manner of mounting a semiconductor laser with respect to an optical waveguide with high accuracy employing a hybrid mounted device and method of manufacturing the same in the fifth embodiment according to the present invention.

FIG. 8 shows a top view for explaining the manner of mounting the semiconductor laser 21 with respect to the optical waveguide 12 with high accuracy for optical axis alignment employing a hybrid mounted device and method of manufacturing the same in the fifth embodiment according to the present invention. In the first to fourth embodiments, one set of initial positional deviation amount measuring marks are used. The fifth embodiment is different from the first to fourth embodiments in that two sets of initial positional deviation amount measuring marks are used.

That is, as shown in FIG. 8, initial positional deviation amount measuring marks M5 in this embodiment are configured by a circular reference mark M51 and a circular alignment mark M52 similar to the third embodiment, and are arranged at both sides of the optical waveguide 12. In this way, two sets of the initial positional deviation amount measuring marks M5 are arranged so as to cope with the components of the positional deviation in the vertical direction and parallel direction ("x" direction and "z" direction) with respect to the light propagation direction of the optical waveguide 12, and the component of the positional deviation in the rotational direction ($\theta$).

In the first to fourth embodiments, two sets of alignment marks M1 of the semiconductor laser 21 are arranged for the rotational positioning at the time of mounting the semiconductor laser 21. In first place, there is a possibility that the alignment marks M1 themselves are deviated in the rotational direction with respect to the optical waveguide 12. As a counter measure for this, in this embodiment, using two sets of the initial positional deviation amount measuring marks M5, the rotational deviation amount ($\theta$) of the alignment marks M52 with respect to the reference marks M51 is measured, and positional correction for the component of the rotational direction ($\theta$) for the mounting position of the semiconductor laser 21 is performed according to the rotational deviation amount ($\theta$) (refer to the position of the semiconductor laser 21 before correction and that after correction in FIG. 8).

As the initial positional deviation amount measuring marks M5, circular marks may be used as in the case of this embodiment and the third embodiment, or the vernier caliper pattern may be used as in the case of the second embodiment. Otherwise, as in the case of the fourth embodiment, both the marks and pattern may be used.

The shape of the alignment marks and the initial positional deviation amount measuring marks in the respective embodiments is not restricted to the circular shape or the vernier caliper pattern, and any shape may be employed so long as the function is carried out. For example, instead of the circular marks, marks of other shapes, or polygon shape such as quadrangle shape, ellipse shape, crisscross shape, etc. may be employed. Furthermore, the vernier caliper pattern is not restricted to the crisscross pattern having scales engraved in two directions, and a pattern having scales engraved in a single direction may be employed.

In the respective embodiments, as a hybrid mounted device, there is employed an optical device such as a device for optical communication that bonds a semiconductor laser on a silicon platform being a planar optical circuit board having an optical wave guide formed on part thereof, and optically couples the optical waveguide and the semiconductor laser. On the other hand, the present invention is not restricted to this, and any hybrid mounted device that bonds a semiconductor chip onto a board employing the visual alignment mounting method may be employed.

Although the exemplary embodiments of the present invention have been described in detail, it should be understood that various changes, substitutions and alternatives can be made therein without departing from the spirit and scope of the invention as defined by the appended claims. Further, it is the inventor's intent to retain all equivalents of the claimed invention even if the claims are amended during prosecution.

What is claimed is:

1. A hybrid mounted device, comprising:
   an element;
   a board onto which the element is mounted; first mounting position marks formed on the board; second mounting position marks formed on the element, a mounting position of the element on the board being determined by positioning the first mounting position marks and the second mounting position marks with each other; and
   initial positional deviation amount measuring marks which are so formed on the board as to be able to measure an initial positional deviation amount of the first mounting position marks, the mounting position of the element being corrected to a position where the second mounting position marks are shifted with respect to the first mounting position marks according to the initial positional deviation amount of the first mounting position marks measured from the initial positional deviation amount measuring marks,
   wherein the initial positional deviation amount measuring marks include:
   reference marks which are formed on the board before the first mounting position marks are formed, and work as measurement reference of the initial positional deviation amount of the first mounting position marks;
   alignment marks which are formed on the board when the first mounting position marks are formed, and form pairs together with the reference marks; and
   the initial positional deviation amount is measured as a positional deviation amount of the alignment marks with respect to the reference marks.

2. The hybrid mounted device according to claim 1, wherein an absolute value of positional deviation amount between the first mounting position marks and the second mounting position marks is equal to or within $.+-0.2\,\mu m$ from an absolute value of the initial positional deviation amount measured from the initial positional deviation amount measuring marks.

3. The hybrid mounted device according to claim 1, wherein the reference marks and the alignment marks are configured by vernier caliper pattern that can measure the positional deviation amount using positional relationship of mutual scales thereof.

4. The hybrid mounted device according to claim 1, wherein the reference marks and the alignment marks are configured by circular marks.

5. The hybrid mounted device according to claim 1, wherein the first mounting position marks and the second mounting position marks are configured by vernier caliper pattern that can measure the positional deviation amount using positional Relationship of mutual scales thereof.

6. The hybrid mounted device according to claim 1, wherein the element is a semiconductor laser.

7. The hybrid mounted device according to claim 1, wherein the board is a planar optical circuit board having an optical waveguide formed on part thereof, and the optical waveguide is optically coupled to the element.

8. The hybrid mounted device according to claim 7, wherein the initial positional deviation amount measuring marks are so configured as to be able to detect the initial positional deviation amount at least in a direction perpendicular to the light propagation direction of the optical waveguide.

9. The hybrid mounted device according to claim 1, wherein at least one of the first mounting position marks and the initial positional deviation amount measuring marks are formed by at least two sets or more.

10. The hybrid mounted device according to claim 1, wherein the hybrid mounted device is a device for optical communication.

* * * * *